United States Patent
Fan et al.

(10) Patent No.: US 7,821,435 B2
(45) Date of Patent: Oct. 26, 2010

(54) BACKGROUND CALIBRATION SYSTEM FOR CALIBRATING NON-LINEAR DISTORTION OF AMPLIFIER AND METHOD THEREOF

(75) Inventors: Jen-Lin Fan, Sinpu Township, Hsinchu County (TW); Jieh-Tsorng Wu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 65 days.

(21) Appl. No.: 12/424,286

(22) Filed: Apr. 15, 2009

(65) Prior Publication Data

US 2009/0309772 A1 Dec. 17, 2009

(30) Foreign Application Priority Data

Jun. 13, 2008 (TW) .............................. 97122170 A

(51) Int. Cl.
*H03M 1/00* (2006.01)
(52) U.S. Cl. ...................... 341/120; 341/118; 341/155
(58) Field of Classification Search ................. 341/118, 341/120
See application file for complete search history.

(56) References Cited

U.S. PATENT DOCUMENTS 6,784,814 B1 * 8/2004 Nair et al. .................... 341/118
7,187,310 B2 * 3/2007 El-Sankary et al. ......... 341/120

OTHER PUBLICATIONS

B. Murmann and B. E. Boser, "A 12-bit 75-MS/s pipelined ADC using open-loop residue amplification," IEEE J. Solid-State Circuits, Dec. 2003, pp. 2040-2050, vol. 38, No. 12.

J. P. Keane, P. J. Hurst, and S. H. Lewis, "Background interstage gain calibration technique for pipelined ADCs," IEEE Trans. Circuits Syst. I, Jan. 2005, pp. 32-43, vol. 52, No. 1.

J. Yuan, N. Farhat, and J. V. der Spiegel, "A 50 MS/s 12-bit CMOS pipeline A/D converter with nonlinear background calibration," in Proceedings of the IEEE Custom Integrated Circuits Conference, Sep. 2005, pp. 399-402.

C. R. Grace, P. J. Hurst, and S. H. Lewis, "A 12-bit 80-MSample/s pipelined ADC with bootstrapped digital calibration," IEEE J. Solid-State Circuits, May 2005, pp. 1038-1046, vol. 40, No. 40.

A. Panigada and I. Galton, "Digital background correction of harmonic distortion in pipelined ADCs," IEEE Trans. Circuits Syst. I, Sep. 2006, pp. 1885-1895, vol. 53, No. 9.

* cited by examiner

*Primary Examiner*—Khai M Nguyen
(74) *Attorney, Agent, or Firm*—Muncy, Geissler, Olds & Lowe, PLLC

(57) ABSTRACT

The present invention discloses a background calibration system and method for calibrating the non-linear distortion of the amplifier. The calibration method in the present invention includes: generating random sequences and inputting the random sequences in different amount and different sets into an amplifier; amplifying the random sequences and detecting linear and non-linear coefficients; quantizing the output linear signal from the amplifier, and generating a digital output signal; multiplying the digital output signal to generate a high-order signal; generating an estimated non-linear error for the amplifier by multiplying the high-order signal with the estimated non-linear coefficient; adding the non-linear signal with the digital output signal to generate a linear output signal; calculating the random value from the parameter extractor to determine the occurrence of non-linear distortion in the circuit, and further adjusting the non-linear coefficient to calibrating the amplifier.

19 Claims, 3 Drawing Sheets

BACKGROUND CALIBRATION SYSTEM FOR CALIBRATING NON-LINEAR DISTORTION OF AMPLIFIER AND METHOD THEREOF

BACKGROUND OF THE INVENTION

1. Field of the Invention

The invention relates to a background calibration method and system, and more particularly, to a background calibration system for calibrating the non-linear distortion of the amplifier applied in an analog-digital converter circuit and method thereof.

2. Description of the Related Art

The amplifier circuit is well known in the art and commonly used in the analog-digital converter (ADC) system, such as the Pipelined ADC or the Sub-ranging ADC. However, the traditional amplifier remains a major challenge in the non-linear distortion phenomena. The non-linear distortion of the amplifier would degrade the performance of ADC system. Therefore, in order to boost the performance of ADC system, the error generated by the non-linear distortion of the amplifier must be compensated. With the progress of semiconductor manufacture process, the design of amplifier is always accompanied by a smaller gain and an increasing non-linear distortion. Up to now, most proposed researches in the art focused on the solution of finite linear gain of the amplifier, and few paid attention to the non-linear distortion problem.

For example, a large group of proposed researches for calibration of non-linear distortion are based on digital calibration themes with "correlation based," which are not applicable for DC signals. Moreover, some calibration techniques need one more high-accuracy ADC in the circuit to generate a reference signal. The unavoidable ADC would significantly increase the cost and chip area of the circuit. Additionally, some calibration techniques can only perform offline calibrations, which are unable to calibrate for the real-time change of environment or temperature.

Specifically, in the thesis "A 12-bit 75-MS/s pipelined ADC using open-loop residue amplification" by B. Murmann and B. E. Boser, a non-linear calibration method based on the random switch transfer feature and statistic result was proposed. However, this method can merely deal with the signal with normal-distribution pattern, and merely calibrate the third-order non-linear distortion. Above the third-order, this method will not be applicable. Another calibration method with correlation based was proposed by J. P. Keane, P. J. Hurst, and S. H. Lewis in the thesis "Background interstage gain calibration technique for pipelined ADCs." This method determines the characteristic of non-linear distortion by calculating the output signal of backend ADC with correlation based. Same, this method can only calibrate the third-order non-linear distortion, and it is not capable of calculating the non-linear distortion of DC signal. Still another calibration method was proposed by J. Yuan, N. Farhat and J. V. der Spiegel in the thesis "A 50 MS/s 12-bit CMOS pipeline A/D converter with nonlinear background calibration." This method utilizes output signals from an additional low-speed and high-accuracy ADC as the reference signals to collect the non-linear distortion signals, and then calculated a proper curve to minimize the distortion error. However, this unavoidable ADC would significantly increase the cost and hardware area of the entire circuit. Additionally, in the thesis "A 12-bit 80-MSample/s pipelined ADC with bootstrapped digital calibration" by C. R. Grace, P. J. Hurst and S. H. Lewis, a foreground calibration method was proposed. This method calculates the coefficient of non-linear distortion before the operation of ADC, and then compensates the error of non-linear distortion according to this coefficient during the operation. As mentioned above, this method can only perform offline calibrations, which are unable to adjust the calibration for the real-time change, such as environmental or temperate difference, or the variety of supply voltages. Lastly, in the thesis "Digital background correction of harmonic distortion in pipelined ADCs" by A. Panigada and I. Galton, a background correction method is proposed. This method utilizes the signals with random sequences to extract the non-linear coefficients with correlation based. The drawback of this method is that the random sequences signals require an additional output signal swing, which increases the loading of circuit under this low supply voltage environment. Moreover, although this method can calibrate high-order non-linear distortion, the requirement of inputting more random sequences would increase more output signal swing, which would dramatically decrease the performance of ADC system.

Therefore, to solve the above-mentioned problems and non-linear limitation of the amplifier, the present invention proposes a novel background calibration system and method for calibrating the non-linear distortion of the amplifier. The present invention calculates the high-order non-linear coefficients by inputting the random sequences in the circuit to calibrate the non-linear distortion of the amplifier. The present invention can dramatically increase the circuit's speed, lower the requirement of amplifier's gain, and reduce the complexity of IC design. Moreover, the accuracy of the non-linear distortion coefficients calculated by the present invention will not be affected by the characteristic signals. Without any extra ADC, the present invention can thereby reduce the implementation cost and power consumption of the amplifier circuit and reduce the precious chip area.

SUMMARY OF THE INVENTION

It is therefore one of the many objectives of the claimed invention to provide a background calibration system and method for calibrating the non-linear distortion of the amplifier. The calibration system includes a pseudo random number generator, an amplifier, a backend analog-digital converter (ADC), a nonlinearity compensation circuit, a parameter extractor, and a non-linear coefficient detector. The pseudo random number generator is utilized for generating random sequences and inputting the random sequences in different amount and different sets into the amplifier. The amplifier amplifies the random sequences and detects linear and non-linear coefficients. The backend ADC, coupled to the amplifier, is utilized for quantizing the output linear signal from the amplifier, and generating a digital output signal. The nonlinearity compensation circuit is utilized for multiplying the digital output signal from the backend ADC so as to generate a high-order signal (e.g. the second-order or third order). Then the nonlinearity compensation circuit generates an estimated non-linear error for the amplifier by multiplying the high-order signal with the estimated non-linear coefficient. Then the adder in the nonlinearity compensation circuit adds the non-linear signal with the digital output signal from the backend ADC to generate a linear output signal. The parameter extractor is composed of a first-order extractor and a high-order extractor. The first-order extractor is utilized for calculating the inputted random value; and the high-order extractor is utilized for calculating the high-order random value. Lastly, the non-linear coefficient detector calculates the random value from the parameter extractor to determine the occurrence of non-linear distortion in the circuit, and further calculates the non-linear coefficient for the amplifier.

Below, the embodiments of the present invention are described in detail in cooperation with the attached drawings to make easily understood the objectives, technical contents, characteristics and accomplishments of the present invention.

DETAILED DESCRIPTION OF THE INVENTION

Figure 1:
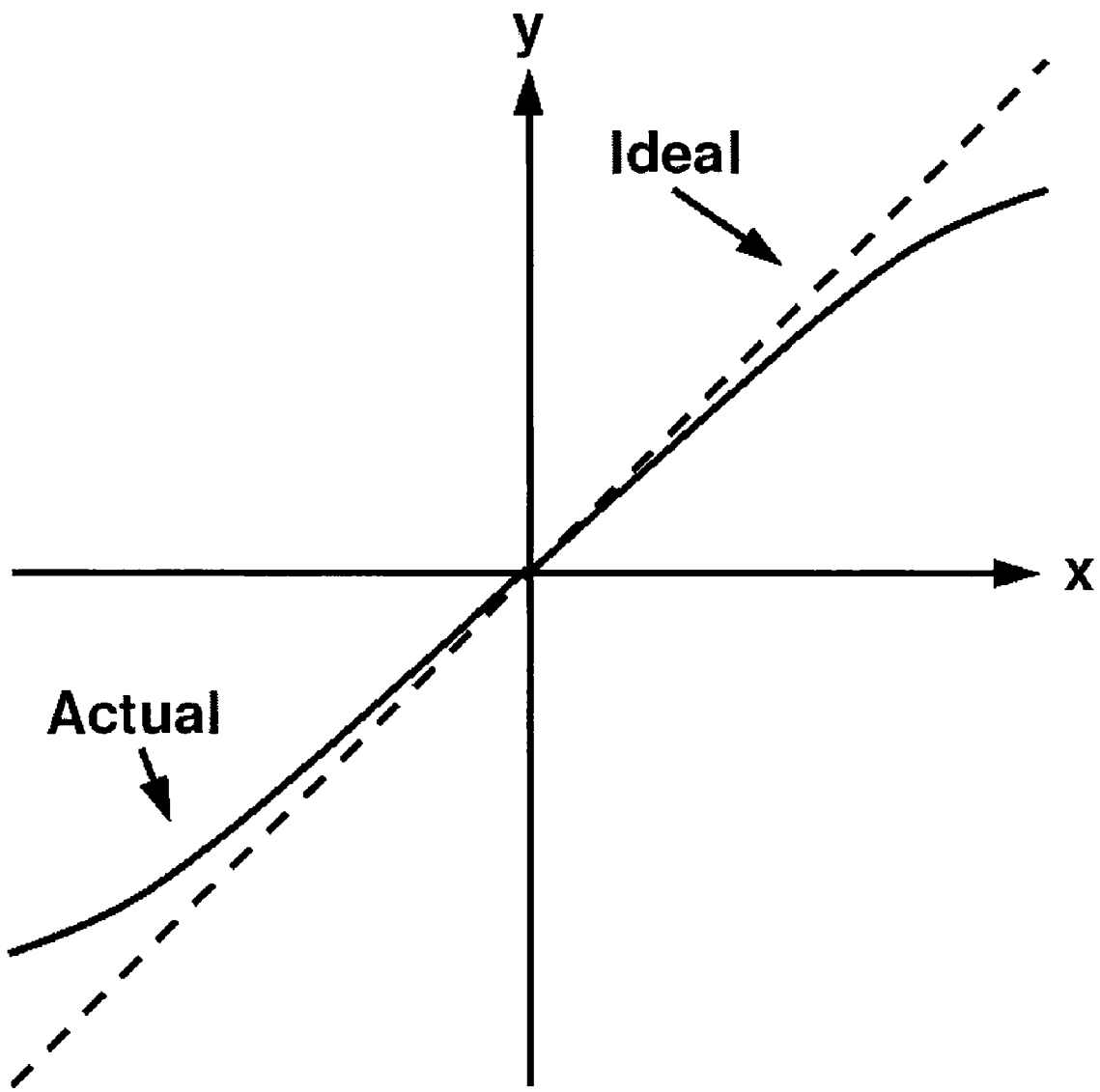
FIG. 1 is a diagram schematically showing the transfer curve between the input signal and output signal of an amplifier.

The present invention provides a background calibration method and system for calibrating the non-linear distortion of the amplifier applied in an ADC circuit, and more particularly, a background calibration method and system for calculating the high-order non-linear coefficients by inputting the random sequences in the circuit to calibrate the non-linear distortion of the amplifier.

The calibration system in the present invention fundamentally includes a pseudo random number generator, an amplifier, a backend ADC, a nonlinearity compensation circuit, a parameter extractor, and a non-linear coefficient detector. The pseudo random number generator is utilized for generating random sequences and inputting the random sequences in different amount and different combinations into the amplifier. The amplifier amplifies the random sequences and detects linear and non-linear coefficients. The backend ADC, coupled to the amplifier, is utilized for quantizing the output linear signal from the amplifier, and generating a digital output signal. Next, the nonlinearity compensation circuit multiplies the digital output signal from the backend ADC so as to generate a high-order signal (e.g. the second-order or third order). Then the nonlinearity compensation circuit generates an estimated non-linear error value for the amplifier by multiplying the high-order signal with the estimated non-linear coefficient. The adder in the nonlinearity compensation circuit adds the non-linear signal with the digital output signal from the backend ADC to generate a linear output signal. The parameter extractor is composed of a first-order extractor and a high-order extractor. The first-order extractor is utilized for calculating the inputted random value. The high-order extractor is utilized for calculating the high-order random value. Lastly, the non-linear coefficient detector calculates the random value from the parameter extractor to determine the occurrence of non-linear distortion in the circuit, and further calculates the non-linear coefficient for the amplifier.

The calibration method in the present invention is described as follows. First, the random sequences with different amount and different combinations are mixed into the input signal before the amplifier. That is, the random sequences, together with the input signal, will be amplified by the amplifier. Next, the amplified input signal (with random sequences) will be quantized to a digital output signal by the backend ADC. The digital output signal is then sent to the nonlinearity compensation circuit to generate a linear output signal. Meanwhile, the linear output signal, together with the digital output signal from the backend ADC, will be extracted by the parameter extractor. Lastly, the calibration parameter of the non-linear coefficient will be calculated by the non-linear coefficient detector. And the non-linear coefficient will be outputted to the nonlinearity compensation circuit so as to perform the non-linear compensation for the amplifier. Accordingly, the objective of background calibration for the amplifier's non-linear distortion is thereby achieved. Please note that, the non-linear coefficient detector is composed of an accumulator, an adder, and a subtractor. The non-linear coefficient detector is utilized for calculating the coefficient of the non-linear distortion based on the value of the mixed random sequences.

As mentioned above, the parameter extractor includes a first-order extractor and a high-order extractor. The first-order extractor is utilized for classifying the linear output signals based on the situation of input signal with random sequences, accumulating the linear output signals by the accumulator, and averaging the signals to produce an expectation value. Next, the first-order extractor subtracts the linear output expectation value without any mixed random value from the linear output expectation value with mixed random sequences to obtain a first-order random value. On the other hand, the high-order extractor can multiply the digital output signals from the backend ADC to generate second-order, third-order, or fifth order signals. The multiplexer (MUX) in the high-order extractor can classify the high-order signals base on the mixed degree of the random sequences, and the accumulator can accumulate the high-order signals and average the signals to produce an expectation value. Next, the high-order extractor subtracts the high-order expectation value without any mixed random value from the high-order expectation value with mixed random sequences to obtain a high-order random value.

Moreover, the non-linear coefficient detector in the present invention is utilized for subtracting the sum of the respective first-order value from the sum of the corresponding first-order value mixed with random sequences to obtain a non-linear error value. When the non-linear error value is compensated, all the first-order error values will be reduced to zero. Furthermore, the non-linear coefficient detector also subtracts the sum of the respective high-order value from the sum of the corresponding high-order value mixed with random sequences to obtain a high-order error value. Please note that, the calculating method of error value in the present invention is not limited to the above description. That is, in other embodiments, the error value can be calculated by different conditions depending on design requirements. For instance, when the non-linear coefficient detector is applied in detecting only one non-linear coefficient, the divider can divide the first-order non-linear error value by the corresponding high-order error value (e.g. third-order error value). And the quotient calculated by the divider can be referred to the error value between the estimated non-linear coefficient and the actual non-linear coefficient. Moreover, this quotient can be generated by accumulating alone in the accumulator, or multiplying with a fixed coefficient and then accumulating in the accumulator. The result in the accumulator will be referred to the estimated non-linear coefficient and sent to the nonlinearity compensation circuit.

Moreover, other possible method can be implemented in the non-linear coefficient detector as well, and as such, methods obtaining the same objective also belong to the claimed invention. For example, while dealing with the circumstance of only one non-linear coefficient, the non-linear coefficient detector can further include a polarity detector to detect the polarities of the first-order non-linear error value and the high-order error value. Based on the polarities of the first-order non-linear error value and the high-order error value, the polarity detector can determine the polarities of the estimated non-linear coefficient and the actual non-linear coefficient. If the polarities of the first-order non-linear error value and the high-order error value are the same, the present system will multiply the modulus of the first-order non-linear error value with a fixed negative coefficient, and then accumulate the result by the accumulator. The result from the accumulator will be referred to the estimated non-linear coefficient, and sent to the nonlinearity compensation circuit. On the contrary, if the polarities of the first-order non-linear error value and the high-order error value are different, the present system will multiply the modulus of the first-order non-linear error value with a fixed positive coefficient, and then accumulate the result by the accumulator. The result from the accumulator will be referred to the estimated non-linear coefficient, and sent to the nonlinearity compensation circuit.

Additionally, when the non-linear coefficient detector is applied in detecting multiple non-linear coefficients, it can input the multiple first-order non-linear error values and multiple high-order error value into a calculator. The calculator will calculate the simultaneous equation of these error values to generate a solution, which will be referred to the error value between the estimated non-linear coefficient and the actual non-linear coefficient. Moreover, this solution can be accumulated alone in the accumulator, or multiplied with a fixed coefficient and then accumulated in the accumulator. The result in the accumulator will be referred to the estimated non-linear coefficient and sent to the nonlinearity compensation circuit for further operation. The process of equations is detailed as follows.

Please refer to FIG. 1. FIG. 1 is a diagram schematically showing the transfer cure between the input signal and output signal of an amplifier. As shown in FIG. 1, the dotted line donates an ideal curve. The linear relationship between the input signal (x) and the output signal (y) can be expressed by the following equation:

$$y = G(x) = a_1 \cdot (x+o) \tag{1}$$

Where o is the input offset voltage of the amplifier, and $a_1$ is the first-order linearly amplify coefficient. Moreover, as shown in FIG. 1, the solid line donates a actual curecurve, which indicates the input signal (x) and the output signal (y) have the odd-order non-linear distortion, expressed by:

$$y = G(x) = a_1 \cdot (x+o) - a_3 \cdot (x+o)^3 - a_5 \cdot (x+o)^5 - \tag{2}$$

Please note that, the coefficients a3, a5 ... of the non-linear distortion is related to the supply voltage of the amplifier, the output resistance, and the output signal swing of the amplifier ... etc. If we replace $(a_1 \cdot (x+o))$ by Y, the equation (2) can be further rewritten as:

$$Y = y + b_3 \cdot Y^3 + b_5 \cdot Y^5 + \tag{3}$$

Where the equation (3) can be further extracted as:

$$b_3 = \frac{a_3}{a_1^3} \quad b_5 = \frac{a_5}{a_1^5} \ldots \tag{4}$$

In the equation (3), we express the non-linear distortion by replacing the input signal (x) to the linear output signal (Y). That is, in the equation (3), the output signal with non-linear distortion can be properly compensated to an output signal without any distortion.

Figure 2:
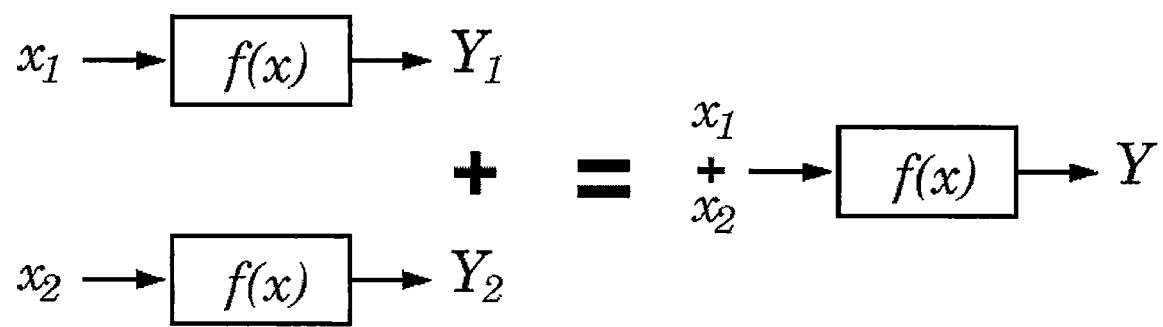
FIG. 2 is a diagram schematically showing the equations between the input signal and output signal of an amplifier.

From the concept of the signal and system engineering, a linear system must follow the superposition theory. Please refer to FIG. 2. FIG. 2 is a diagram schematically showing the equations between the input signal and output signal of an amplifier. As shown in FIG. 2, the system f(x) is the system characteristic equation, x1 and x2 are system input signals, and Y1, Y2, Y are system output signals. When the system f(x) is a linear system, the equal sign in FIG. 2 is established, which means $Y_1+Y_2=Y$. On the contrary, if the system $f(x)$ is a non-linear system, the equation in FIG. 2 is not held, which means $Y_1+Y_2 \neq Y$. The above-mentioned concept can also be implemented by the following non-linear detection and compensation.

Figure 3:
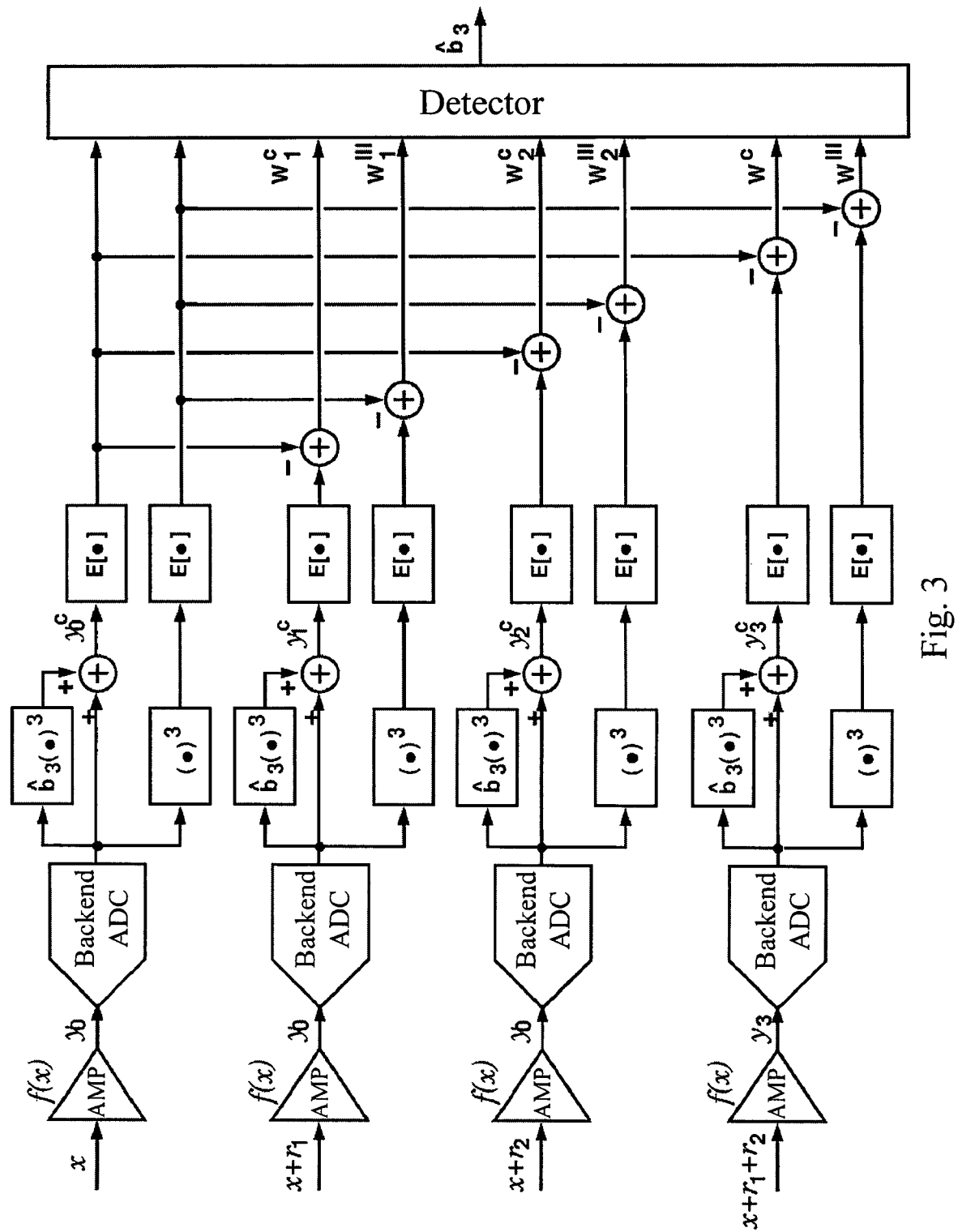
FIG. 3 is a diagram schematically showing a non-linear detection and compensation circuit according to the present invention.

Please refer to FIG. 3. FIG. 3 is a diagram schematically showing a non-linear detection and compensation circuit according to the present invention. Please note that, the amplifier and the backend ADC shown in FIG. 3 can be treated as one part of a complete ADC system. As shown in FIG. 3, x is referred to the input signal of the amplifiers, and y is referred to the output signal of the amplifiers. $f(x)$ is referred to the transfer characteristic of the amplifiers. The backend ADCs quantizes the output signals into the digital output signals. Here, the present invention first mixes different random sequences $r_1$, $r_2$ and $r_1+r_2$ into the amplifiers, quantizes the output signals of amplifiers, compensates the digital signals from the backend ADCs by non-linear error compensation, collects the compensated signals, and average them so as to calculate the expectation value. If the amplifier linearly amplifies the signals, which indicates there is no non-linear distortion, then the equation (3) can be further rewritten by:

$$\begin{cases} Y = y_0 \\ Y + R_1 = y_1 \\ Y + R_2 = y_2 \\ Y + R_1 + R_2 = y_3 \end{cases} \tag{5}$$

Where $R_1 = a_1 \cdot r_1$, $R_2 = a_1 \cdot r_2$, $Y = a_1 \cdot (x+o)$. If we collect the expectation values for both sides of the equation (5), and then subtract them, the equation (5) can be transformed as:

$$\begin{cases} R_1 = W_1 \\ R_2 = W_2 \\ R_1 + R_2 = W \end{cases} \tag{6}$$

That is, when the system is a linear system, $W=W_1+W_2$. Assume that the expectation values E[Y] of the output signals are the same under these four circumstances. If the system is a non-linear system and includes a third-order non-linear distortion, then the equation (3) can be transformed as:

$$\begin{cases} Y = y_0 + b_3 \cdot Y^3 \approx y_0 + b_3 \cdot y_0^3 \\ Y + R_1 = y_1 + b_3 \cdot (Y+R_1)^3 \approx y_1 + b_3 \cdot y_1^3 \\ Y + R_2 = y_2 + b_3 \cdot (Y+R_2)^3 \approx y_2 + b_3 \cdot y_2^3 \\ Y + R_1 + R_2 = y_3 + b_3 \cdot (Y+R_1+R_2)^3 \approx y_3 + b_3 \cdot y_3^3 \end{cases} \tag{7}$$

Assuming that the non-linear distortion in the system is not severe, the equation can be expressed by:

$$\begin{cases} y_0^3 \approx Y^3 \\ y_1^3 \approx (Y+R_1)^3 \\ y_2^3 \approx (Y+R_2)^3 \\ y_3^3 \approx (Y+R_1+R_2)^3 \end{cases} \tag{8}$$

According to the equation (8), the equation $y_n{}^c = y_n + \hat{b}_3 \cdot y_n{}^3$ can be further induced. $\hat{b}_3$ is referred to the estimated value of the non-linear coefficient $b_3$. The equation (7) can be further rewritten by:

$$\begin{cases} Y \approx y_0^c + \Delta b_3 \cdot y_0^3 \\ Y + R_1 \approx y_1^c + \Delta b_3 \cdot y_1^3 \\ Y + R_2 \approx y_2^c + \Delta b_3 \cdot y_2^3 \\ Y + R_1 + R_2 \approx y_3^c + \Delta b_3 \cdot y_3^3 \end{cases} \quad (9)$$

Where $\Delta b_3 = b_3 - \hat{b}_3$. $\Delta b_3$ denotes the error value between the estimated value of the non-linear coefficient and the actual value of the non-linear coefficient. After collecting the expectation values on both sides of the equal sign in the equation (9), and subtract them, we can obtain:

$$\begin{cases} R_1 = W_1^c + \Delta b_3 \cdot (E[y_1^3] - E[y_0^3]) \\ R_2 = W_2^c + \Delta b_3 \cdot (E[y_2^3] - E[y_0^3]) \\ R_1 + R_2 = W^c + \Delta b_3 \cdot (E[y_3^3] - E[y_0^3]) \end{cases} \quad (10)$$

Where $W_1^c = E[y_1^c] - E[y_0^c]$, $W_2^c = E[y_2^c] - E[y_0^c]$, and $W^c = E[y_3^c] - E[y_0^c]$. That is, when the system is a non-linear system (i.e. $\Delta b_3 \neq 0$), $W^c \neq W_1^c + W_2^c$. Therefore, the calibration method in the present invention can detect and compensate the non-linear distortion of the amplifier, even under the circumstances of offline calibration or background calibration.

Furthermore, if we define an equation as follows:

$$\begin{cases} W_1^{III} = E[y_1^3] - E[y_0^3] \\ W_2^{III} = E[y_2^3] - E[y_0^3] \\ W^{III} = E[y_3^3] - E[y_0^3] \end{cases} \quad (11)$$

And the equation (10) can be further rewritten by:

$$\begin{cases} R_1 = W_1^c + \Delta b_3 \cdot W_1^{III} \\ R_2 = W_2^c + \Delta b_3 \cdot W_2^{III} \\ R_1 + R_2 = W^c + \Delta b_3 \cdot W^{III} \end{cases} \quad (12)$$

Where the function H can be defined by:

$$\begin{cases} H^I = W^c - (W_1^c + W_2^c) \\ H^{III} = W^{III} - (W_1^{III} + W_2^{III}) \end{cases} \quad (13)$$

Then we can derive the equation (14) from the equation (12) and (13):

$$H^I + \Delta b_3 \cdot H^{III} = 0 \quad (14)$$

Where $$\Delta b_3 = -\frac{H^I}{H^{III}} \quad (15)$$

That is, we can discover the non-linear error by determining whether the first-order error $H^I$ is zero, and then further adjust the non-linear coefficient $\hat{b}_3$ to calibrate the non-linear error.

Please note that, the present invention can also calibrate the high-order non-linear distortion. For example, assuming that the amplifier has fifth-order non-linear distortion, the equation (9) can be further rewritten by:

$$\begin{cases} Y \approx y_0^c + \Delta b_3 \cdot y_0^3 + \Delta b_5 \cdot y_0^5 \\ Y + R_1 \approx y_1^c + \Delta b_3 \cdot y_1^3 \Delta b_5 \cdot y_1^5 \\ Y + R_2 \approx y_2^c + \Delta b_3 \cdot y_2^3 + \Delta b_5 \cdot y_2^5 \\ Y + R_1 + R_2 \approx y_3^c + \Delta b_3 \cdot y_3^3 + \Delta b_5 \cdot y_3^5 \end{cases} \quad (16)$$

Where $y_n{}^c = y_n + \hat{b}_3 \cdot y_n{}^3 + \hat{b}_5 \cdot y_n{}^5$, $\hat{b}_3$ is the estimated value of the non-linear coefficient $b_3$, $\hat{b}_5$ is the estimated value of the non-linear coefficient $b_5$, and $\Delta b_3 = b_3 - \hat{b}_3$, $H^I + \Delta b_3 \cdot H^{III} + \Delta b_5 \cdot H^V = 0$. The same, the equation (14) can be rewritten by:

$$H^I + \Delta b_3 \cdot H^{III} + \Delta b_5 \cdot H^V = 0 \quad (17)$$

After mixing with different random sequences, we can obtain two equations as follows:

$$\begin{cases} H_1^I + \Delta b_3 \cdot H_1^{III} + \Delta b_5 \cdot H_1^V = 0 \\ H_2^I + \Delta b_3 \cdot H_2^{III} + \Delta b_5 \cdot H_2^V = 0 \end{cases} \quad (18)$$

According to the equation (18), the solutions of $\Delta b_3$ and $\Delta b_5$ can be found. Therefore, by detecting whether $H_1^I$ and $H_2^I$ are zero, we can discover whether the non-linear error is occurred. If the non-linear error is occurred (i.e. $H_1^I$, $H_2^I \neq 0$), then we can adjust the non-linear coefficient $\hat{b}_3$ and $\hat{b}_5$ until both $H_1^I$ and $H_2^I$ are equal to zero. Similarly, based on the above-mention calibration method, the present invention can also calibrate the even-order non-linear distortion or higher-order non-linear distortion in the amplifier to accomplish the linear objective. Moreover, the present invention can perform the above-mention calibration without interrupting the operation of the ADC system. That is, the calibration method and system thereof in the present invention can dynamically adjust the non-linear error simultaneously during the operation of ADC system, even when the environment of operation is changed. Additionally, the present invention can be applied in different chips without any extra reference ADC. Therefore, the present invention can thereby reduce the implementation cost and power consumption of the amplifier circuit and save the precious chip area.

Those described above are only the preferred embodiments to exemplify the present invention but not to limit the scope of the present invention. Any equivalent modification or variation according to the shapes, structures, features and spirit disclosed in the specification is to be also included within the scope of the present invention.

What is claimed is:

1. A background calibration system for calibrating a non-linear distortion of an amplifier, comprising:

a pseudo random number generator for generating a random signal and mixing said random signal with an input signal;

an amplifier, coupled to said pseudo random number generator, for amplifying said input signal and said mixed random signal, and outputting an amplified signal;

a backend analog-digital converter (ADC), coupled to said amplifier, for quantizing said amplified signal to generate a digital output signal;

a nonlinearity compensation circuit, coupled to said backend ADC, for linearly transferring said digital output signal to generate a linear output signal;

a parameter extractor for comparing said linear output signal from said nonlinearity compensation circuit and said digital output signal from said backend ADC to extract a calibrating parameter; and a non-linear coefficient detector for calculating a non-linear coefficient according to said calibrating parameter, and outputting said non-linear coefficient to said nonlinearity compensation circuit to perform a non-linear error compensation so as to accomplish said background calibration for said non-linear distortion of said amplifier.

2. The calibration system of claim 1, wherein said non-linear coefficient detector comprises at least an accumulator, an adder, and a subtractor.

3. The calibration system of claim 1, wherein said parameter extractor comprises a first-order parameter extractor and a high-order parameter extractor.

4. The calibration system of claim 3, wherein said first-order parameter extractor is utilized for calculating a random value mixed in said input signal.

5. The calibration system of claim 3, wherein said high-order parameter extractor is utilized for extracting a high-order random value.

6. The calibration system of claim 3, wherein said high-order parameter extractor is utilized for multiplying said digital signal by a multiplier to generate at least a high order (e.g. second-order, third-order, or fifth-order), classifying said high orders according to the degree of said mixed random signal by a multiplexer (MUX), accumulating said high orders by said accumulator, and averaging said accumulated result to calculate an expectation value.

7. The calibration system of claim 1, wherein said non-linear coefficient detector is utilized for calculating said random value, detecting whether said non-linear distortion is occurred, and further calculating said non-linear coefficient.

8. The calibration system of claim 1, wherein when only one non-linear coefficient is occurred, said non-linear parameter detector can further comprise a polarity detector for detecting polarities of said first-order non-linear error value and said high-order error value, so as to determine a polarity of a difference between said estimated non-linear coefficient and actual non-linear coefficient.

9. The calibration system of claim 8, wherein said polarity detector is utilized for determining said polarities of said first-order non-linear error value and said high-order error value, if said polarities of said first-order non-linear error value and said high-order error value are the same, a modulus of said first-order non-linear error value will be multiplied with a fixed negative coefficient, accumulated by said accumulator, and said accumulated result will be referred as said estimated non-linear coefficient, and sent to said nonlinearity compensation circuit; if said polarities of said first-order non-linear error value and said high-order error value are not the same, said modulus of said first-order non-linear error value will be multiplied with a fixed positive coefficient, accumulated by said accumulator, and said accumulated result will be referred as said estimated non-linear coefficient, and sent to said nonlinearity compensation circuit.

10. A background calibration method for calibrating a non-linear distortion of an amplifier, comprising:

mixing different random signals with an input signal before inputting said amplifier;

amplifying said input signal and said mixed random signals, and outputting an amplified signal;

quantizing said amplified signal to a digital output signal;

calculating a error value of said digital signal, and adding said error value and said digital signal to generate a linear output signal;

extracting a calibrating parameter according to said linear output signal and said digital output signal; and outputting said calibrating parameter to a non-linear coefficient detector, calculating a non-linear coefficient according to said calibrating parameter, and referring said non-linear coefficient as said estimated non-linear coefficient and feedback to a nonlinearity compensation circuit.

11. The calibration method of claim 10, wherein said random signal is mixed with said input signal by alone, separately, or combined manners.

12. The calibration method of claim 10, wherein said error value is further calculated by said nonlinearity compensation circuit.

13. The calibration method of claim 10, wherein said non-linear coefficient detector comprises at least an accumulator, an adder, and a subtractor.

14. The calibration method of claim 10, wherein said non-linear coefficient detector is utilized for detecting whether said non-linear distortion is occurred, and further calculating said non-linear coefficient.

15. The calibration method of claim 10, wherein when only one non-linear coefficient is occurred, said non-linear parameter detector can further comprise a polarity detector for detecting polarities of said first-order non-linear error value and said high-order error value, so as to determine a polarity of a difference between said estimated non-linear coefficient and actual non-linear coefficient.

16. The calibration method of claim 10, wherein said polarity detector is utilized for determining said polarities of said first-order non-linear error value and said high-order error value, if said polarities of said first-order non-linear error value and said high-order error value are the same, a modulus of said first-order non-linear error value will be multiplied with a fixed negative coefficient, accumulated by said accumulator, and said accumulated result will be referred as said estimated non-linear coefficient, and sent to said nonlinearity compensation circuit; if said polarities of said first-order non-linear error value and said high-order error value are not the same, said modulus of said first-order non-linear error value will be multiplied with a fixed positive coefficient, accumulated by said accumulator, and said accumulated result will be referred as said estimated non-linear coefficient, and sent to said nonlinearity compensation circuit.

17. The calibration method of claim 10, wherein said step of amplifying is performed by an amplifier.

18. The calibration method of claim 10, wherein said step of quantizing is performed by a backend ADC.

19. The calibration method of claim 10, wherein said step of extracting said calibration parameter is performed by a parameter extractor.

* * * * *